(12) United States Patent
Elsherbini et al.

(10) Patent No.: US 10,381,291 B2
(45) Date of Patent: Aug. 13, 2019

(54) LITHOGRAPHACALLY DEFINED VIAS FOR ORGANIC PACKAGE SUBSTRATE SCALING

(71) Applicant: Intel Corporation, Santa Clara, CA (US)

(72) Inventors: Adel A. Elsherbini, Chandler, AZ (US); Henning Braunisch, Phoenix, AZ (US); Brandon M. Rawlings, Chandler, AZ (US); Aleksandar Aleksov, Chandler, AZ (US); Feras Eid, Chandler, AZ (US); Javier Soto, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/745,701

(22) PCT Filed: Sep. 25, 2015

(86) PCT No.: PCT/US2015/052460
§ 371 (c)(1),
(2) Date: Jan. 19, 2018

(87) PCT Pub. No.: WO2017/052647
PCT Pub. Date: Mar. 30, 2017

(65) Prior Publication Data
US 2018/0233431 A1    Aug. 16, 2018

(51) Int. Cl.
*H01L 23/48*    (2006.01)
*H01L 21/48*    (2006.01)
(Continued)

(52) U.S. Cl.
CPC .......... *H01L 23/481* (2013.01); *H01L 21/486* (2013.01); *H01L 21/76897* (2013.01);
(Continued)

(58) Field of Classification Search
None
See application file for complete search history.

(56) References Cited

U.S. PATENT DOCUMENTS

| 2004/0266179 | A1 | 12/2004 | Sharma |
| 2007/0164438 | A1* | 7/2007 | Sir ........................ H01L 21/486 257/758 |

(Continued)

OTHER PUBLICATIONS

International Preliminary Search Report for International Patent Application No. PCT/US2015/052460, dated Apr. 5, 2018, 9 pages.
(Continued)

*Primary Examiner* — Bo B Jang
(74) *Attorney, Agent, or Firm* — Schwabe, Williamson & Wyatt, P.C.

(57) ABSTRACT

Embodiments of the invention include conductive vias and methods for forming the conductive vias. In one embodiment, a via pad is formed over a first dielectric layer and a photoresist layer is formed over the first dielectric layer and the via pad. Embodiments may then include patterning the photoresist layer to form a via opening over the via pad and depositing a conductive material into the via opening to form a via over the via pad. Embodiments may then include removing the photoresist layer and forming a second dielectric layer over the first dielectric layer, the via pad, and the via. For example a top surface of the second dielectric layer is formed above a top surface of the via in some embodiments. Embodiments may then include recessing the second dielectric layer to expose a top portion of the via.

19 Claims, 11 Drawing Sheets

(51) Int. Cl.
*H01L 21/768* (2006.01)
*H01L 23/522* (2006.01)
*H01L 23/532* (2006.01)

(52) U.S. Cl.
CPC ........ *H01L 21/76898* (2013.01); *H01L 23/48* (2013.01); *H01L 23/5226* (2013.01); *H01L 23/53209* (2013.01); *H01L 23/53295* (2013.01)

(56) References Cited

U.S. PATENT DOCUMENTS

| | | |
|---|---|---|
| 2008/0054313 A1 | 3/2008 | Dyer et al. |
| 2009/0075465 A1 | 3/2009 | Fan |
| 2013/0267092 A1 | 10/2013 | Shin et al. |
| 2015/0206836 A1 | 7/2015 | Bian |

OTHER PUBLICATIONS

International Search Report and Written Opinion for International Patent Application No. PCT/US2015/052460 dated May 30, 2016, 12 pgs.

\* cited by examiner

LITHOGRAPHACALLY DEFINED VIAS FOR ORGANIC PACKAGE SUBSTRATE SCALING

CROSS-REFERENCE TO RELATED APPLICATION

This patent application is a U.S. National Phase Application under 35 U.S.C. § 371 of International Application No. PCT/US2015/052460, filed Sep. 25, 2015, entitled "LITHOGRAPHACALLY DEFINED VIAS FOR ORGANIC PACKAGE SUBSTRATE SCALING," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to interconnect lines and vias in semiconductor packages and methods for manufacturing such devices.

BACKGROUND OF THE INVENTION

One of the main drivers for package design rules is the input/output (I/O) density per mm per layer (IO/mm/layer). The I/O density may be limited by the via pad sizes. However, current packaging technologies limit the extent to which the size of the via pads may be reduced. The via pads need to be relatively large due to the laser drilling process used to create the via openings through a dielectric layer above the via pads. Laser drilling is limited by the minimum feature size and the misalignment of the laser when drilling the via opening. For example, the minimum feature size of a laser drilled via opening may be approximately 40 µm or larger when a $CO_2$ laser is used, and the misalignment between the layers may be approximately +/−15 µm or larger. As such, the via pad sizes may need to be approximately 70 µm (i.e., 40+2(15) µm) or larger. Alternative laser sources, such as UV lasers, may be able to reduce the via opening more, but throughput is also greatly decreased.

FIG. 1 is a plan view illustration of a portion of an interconnect layer in a package that illustrates the problem with large pad sizes. In FIG. 1, two conductive lines 130 are formed between the two pads 110. A via 120 is formed on the surface of each pad 110. For simplicity, the dielectric layer through which the vias 120 are formed is omitted. The large diameter of the pads 110 that is needed to allow for a large via 120 and any misalignment, prevents adding more conductive lines 130 between the pads 110. Accordingly, the effective routing density on package layers may be less than 30 IO/mm when laser drilling is used to form the vias. This routing density is not sufficient for some packages, such as server/high-performance computing (HPC) packages. Currently, in order to provide sufficient escape routing density, more expensive technologies need to be used, such as silicon interposers and embedded silicon bridges.

Silicon interposers achieve high routing density because of the design rules available on silicon allowing for significantly reduced line widths and spacing. The use of silicon interposers allows for the vias to be lithographically defined instead of laser drilled. This allows for small vias and misalignment during via formation that may be approximately 1 µm or less. However, silicon interposers are expensive, especially if used for large dies such as server/HPC dies. Often silicon interposers also have a maximum size (e.g., 22 mm×33 mm due to the reticle size used in silicon processing) that is too small for more advanced applications.

The use of embedded silicon bridges has also been proposed as a cheaper alternative to very large silicon interposers. However, the addition of embedding a silicon bridge in the package is more expensive than a purely organic package stack-up.

Thus, improvements are needed in the area of via manufacturing technologies.

DETAILED DESCRIPTION OF THE INVENTION

Figure 1:
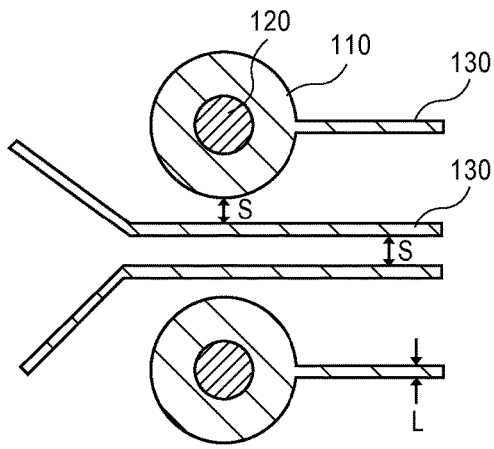
FIG. 1 is a schematic plan view illustration of an interconnect layer with laser drilled vias.

Described herein are systems that include a semiconductor package and methods of forming such semiconductor packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As described above, laser drilling of vias limits the extent to which the via pads may be reduced in size. Accordingly, embodiments of the invention replace the laser drilling of vias with an alternative process that relies on lithographic patterning to define the vias. Lithography enables better alignment and smaller pads compared to laser drilling, which in turn results in higher I/O densities. For example, embodiments allow for scaling the minimum line width and minimum spacing to 2 μm or less, and may include a via pad size that is 21 μm or less. The pad size of 21 μm allows for a 7 μm diameter via with +/−7 μm misalignment.

In addition to increased I/O densities, embodiments of the invention may also improve throughput. For example, lithography-based approaches for forming vias allows for all of the via openings to be patterned at the same time instead of sequentially (which is the case with laser drilling). This provides better scalability as the number of vias increases for next generation substrates. Additionally, the use of lithography allows for the vias to be formed with a plurality of shapes and/or sizes in a single patterning operation.

In one embodiment, the increased I/O density is obtained by replacing the laser drilling for via formation with a lithographic process to form the via on the via pad prior to depositing the next dielectric layer. After the via is formed, a dielectric layer may then be formed over the via pad and the via. The dielectric layer may be recessed to reveal a top surface of the via so that the next layer may be formed. Using a process such as this allows for large pads for die bumps or for standard vias on the next layer, but at the same time allows much higher routing densities since the pads on the next level can overlap space used for conductive traces on the layer below.

Figure 2A:
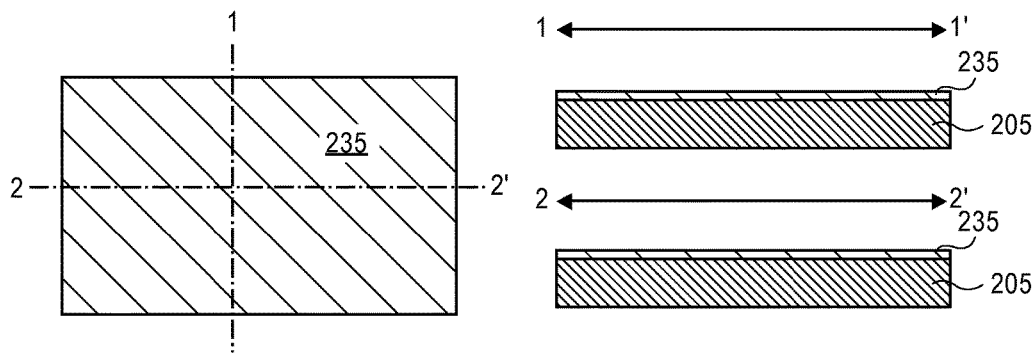
FIG. 2A is a plan view and two corresponding cross-sectional illustrations of a dielectric layer with a seed layer formed over the surface, according to an embodiment of the invention.

Referring now to FIGS. 2A-2J, plan views and corresponding cross-sectional views along lines 1-1' and 2-2' illustrate a process flow for forming vias with a lithographic process, according to an embodiment. Referring now to FIG. 2A, embodiments of the invention may include a seed layer 235 that is deposited over a top surface of a dielectric layer 205. By way of example, the dielectric layer 205 may be a polymer material, such as, for example, polyimide, epoxy or build-up film (BF). In an embodiment, the dielectric layer 205 may be one layer in a stack that includes a plurality of dielectric layers used to form a build-up structure. As such, the dielectric layer 205 may be formed over another dielectric layer. Additional embodiments may include forming the dielectric layer 205 as the first dielectric layer over a core material on which the stack is formed. In an embodiment, the seed layer 235 may be a copper seed layer.

Figure 2B:
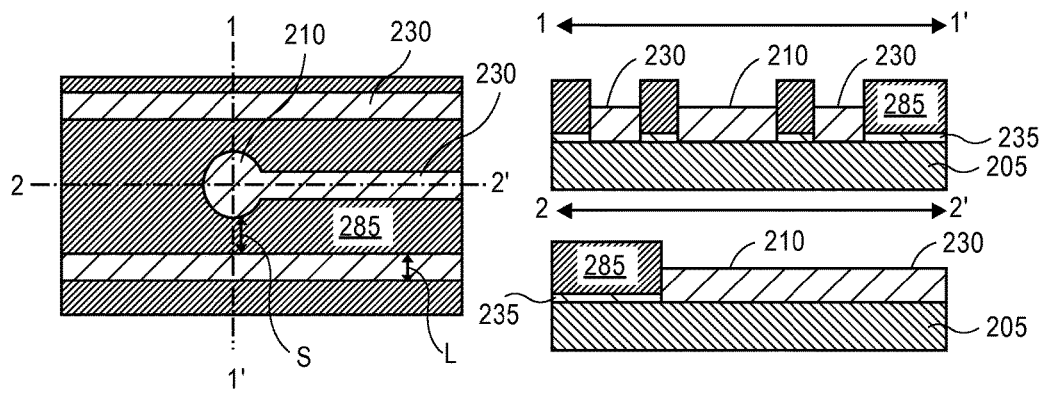
FIG. 2B is a plan view and two corresponding cross-sectional illustrations of the device after conductive lines and a via pad have been formed over the surface, according to an embodiment of the invention.

Referring now to FIG. 2B, a photoresist material 285 may be formed over the seed layer 235 and patterned to provide openings for the formation of conductive lines 230 and via pads 210. According to an embodiment, the patterning of the photoresist material 285 may be implemented with lithographic processes (e.g., exposed with a radiation source through a routing layer mask (not shown) and developed with a developer). After the photoresist material 285 has been patterned, via pads 210 and the conductive lines 230 may be formed. In an embodiment, the via pads 210 and the conductive lines 230 may be formed with an electroplating process, an electroless plating process, or the like.

Embodiments of the invention that use lithography operations allow for the minimum feature size and misalignment to be reduced. As such, the minimum line width L and the minimum spacing S of the patterned features may be smaller than would otherwise be possible when laser drilling is used to form the vias. As such, embodiments of the invention may include a minimum line width L and spacing S that are limited only by the lithography equipment utilized. According to an embodiment, the minimum line width L may be less than 20 µm, and the minimum spacing S may be less than 30 µm. In one particular embodiment, the line width L may be 9 µm or less, and the spacing S may be 12 µm or less. According to an additional embodiment, the minimum line width L and the minimum spacing S may both be approximately 2 µm or less. Additionally, the diameter of the via pad 210 may be limited by the misalignment in the subsequent via formation processes. For example, the misalignment may be less than +/−15 µm. In a particular embodiment, the diameter D of the via pad 210 may be approximately 21 µm when the minimum line width L is approximately 7 µm, and the misalignment M between layers is +/−7 µm. It is to be appreciated that the diameter D may be greater than or less than 21 µm depending on the I/O density requirements needed and the lithography equipment utilized.

Figure 2C:
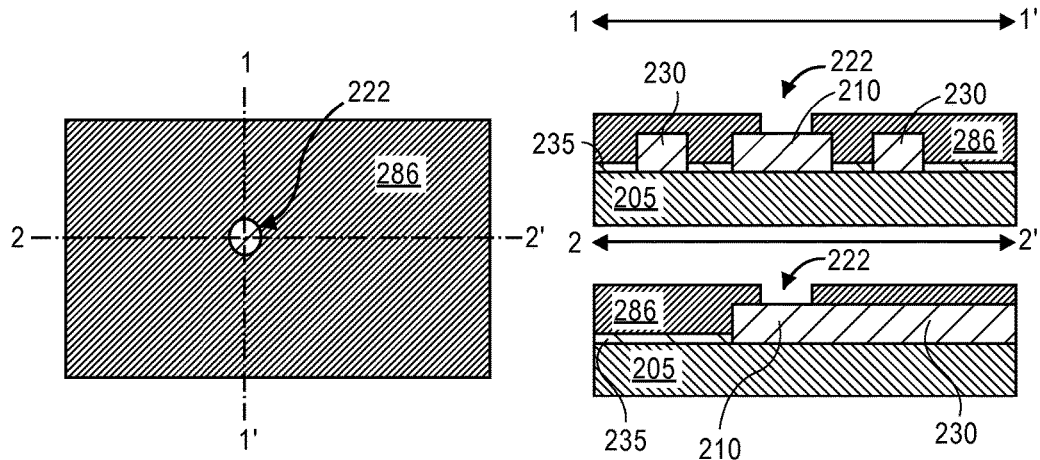
FIG. 2C is a plan view and two corresponding cross-sectional illustrations of the device after a second photoresist material has been deposited and patterned to form a via opening, according to an embodiment of the invention.

Referring now to FIG. 2C, the first photoresist material 285 is stripped, and a second photoresist material 286 is deposited over the conductive lines 230 and the via pad 210. A via opening 222 may then be patterned into the second photoresist material 286 by exposing the second photoresist material 286 to radiation through a via layer mask (not shown) and developing with a developer. It is to be appreciated that only a single via opening 222 is illustrated in FIG. 2C for simplicity, and that a plurality of via openings 222 may be patterned at the same time. As such, the throughput may be increased over laser drilled via openings which need to be formed sequentially. As shown in the cross-sectional views in FIG. 2C, embodiments of the invention include via openings 222 that have substantially vertical sidewalls. It is to be appreciated that embodiments include sidewalls of the via opening 222 that are not tapered, as is the case when laser drilling operations are used to form a via opening through a dielectric layer.

Figure 2D:
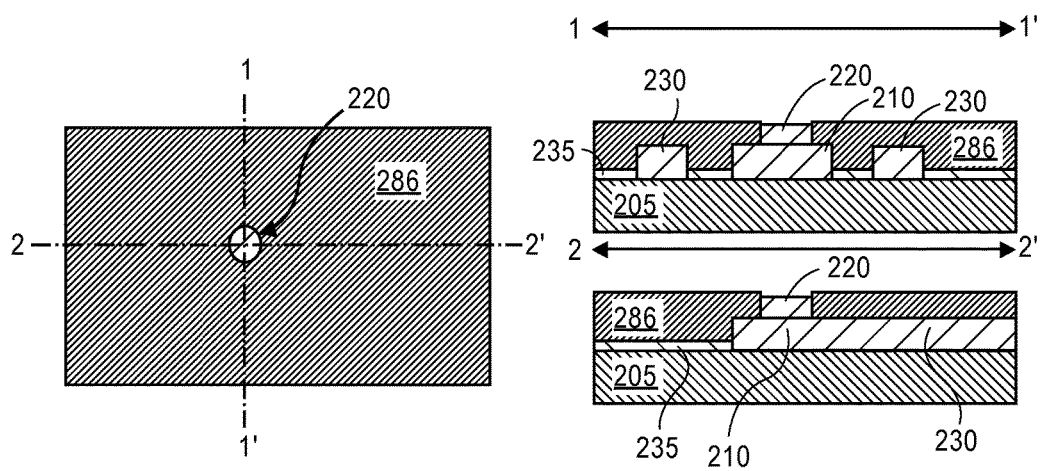
FIG. 2D is a plan view and two corresponding cross-sectional illustrations of the device after the via has been formed in the via opening, according to an embodiment of the invention.

As illustrated in the plan view in FIG. 2C, the via opening 222 is substantially circular. However, additional embodiments are not limited to such configurations. For example, the via opening 222 may be elongated, rectangular, or any other desired shape. According to an embodiment, one or more via openings 222 may be formed with different shapes and/or sizes. The use of lithography patterning to form the via openings 222 allows for a plurality of sizes and shapes to be formed in a single patterning operation. Referring now to FIG. 2D, the via 220 is formed in the via opening 222. According to an embodiment, the via 220 may be formed with any suitable deposition process, such as electroplating, electroless plating, or the like.

Figure 2E:
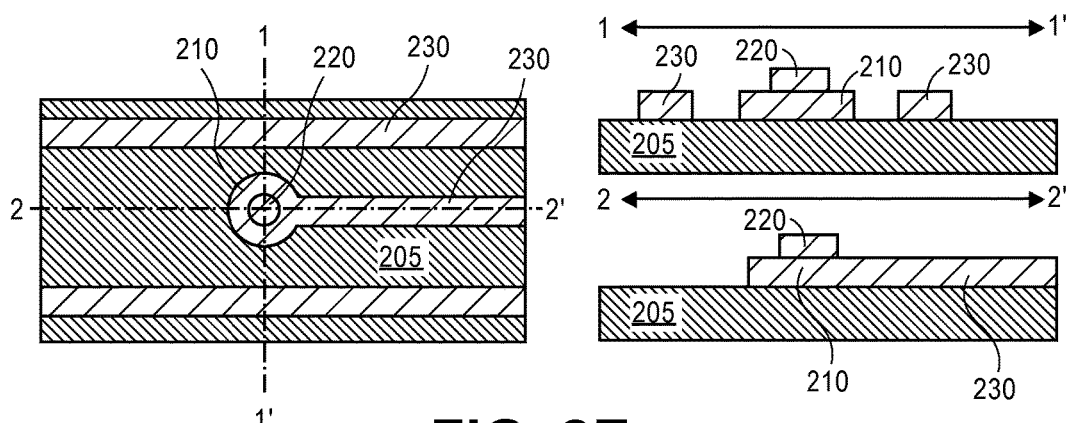
FIG. 2E is a plan view and two corresponding cross-sectional illustrations of the device after the second photoresist material and the exposed portions of the seed layer have been removed, according to an embodiment of the invention.

Referring now to FIG. 2E, the second photoresist material 286 is stripped and the remaining portions of the seed layer 235 are removed. According to an embodiment, the seed layer 235 may be removed with a flash etching process. As shown in the illustrated embodiment, the via 220 is formed prior to the formation of the second dielectric layer. In contrast, the laser drilling processes described above require the formation of the second dielectric layer prior to the formation of the vias.

Figure 2F:
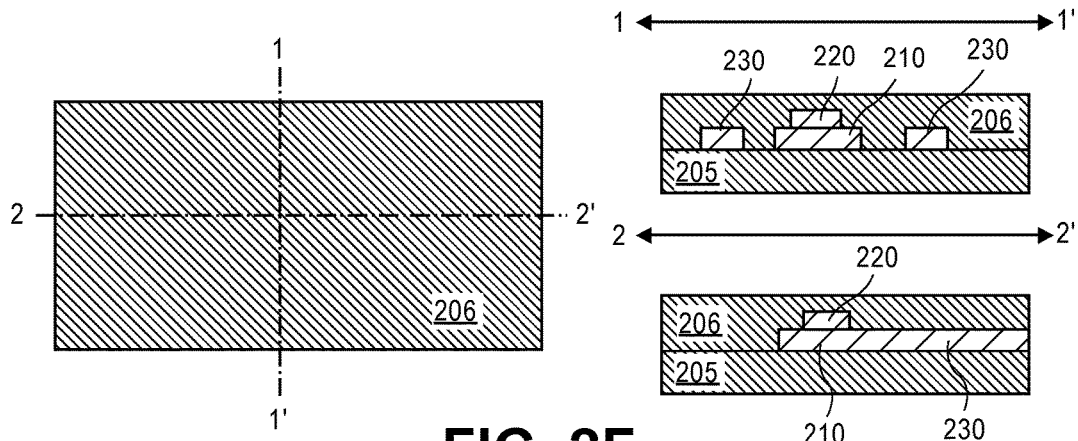
FIG. 2F is a plan view and two corresponding cross-sectional illustrations of the device after a second dielectric layer has been formed over the surface, according to an embodiment of the invention.

Referring now to FIG. 2F, a second dielectric layer 206 is formed over the exposed via 220, pad 210, and conductive lines 230. According to an embodiment the second dielectric layer 206 may be formed with any suitable process, such as lamination or slit coating and curing. In an embodiment, the second dielectric layer 206 is formed to a thickness that will completely cover a top surface of the via 220. As opposed to layer formation on crystalline structures (e.g., silicon substrates), each of the dielectric layers may not be highly uniform. Accordingly, the second dielectric layer 206 may be formed to a thickness that is greater than the via 220 to ensure that the proper thickness is reached across the entire substrate. In some embodiments, the thickness of the second dielectric layer 206 may be minimized in order to reduce the etching time required to expose the vias 220 in a subsequent processing operation. In other embodiments, when the thickness of the dielectric can be well controlled, the vias 220 may extend above the top surface of the second dielectric layer 206. This may be beneficial because the subsequent controlled dielectric removal process described in FIG. 2G may be omitted.

Figure 2G:
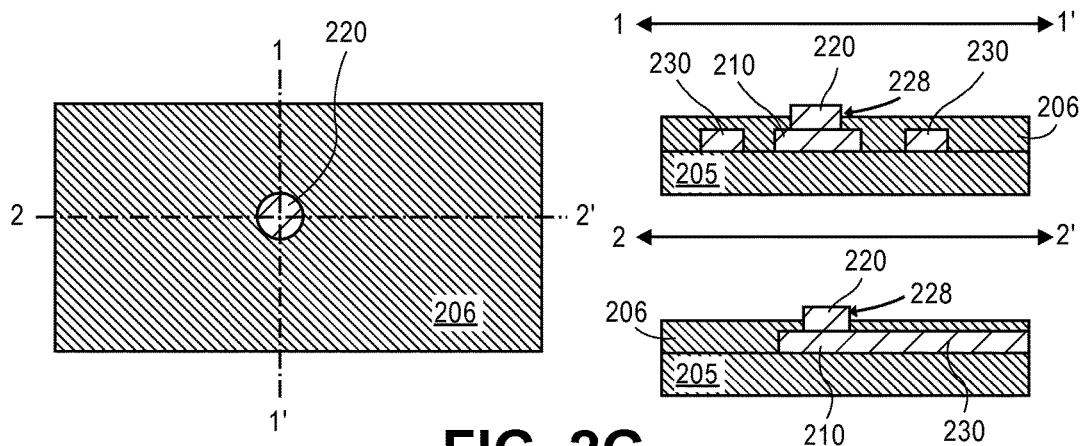
FIG. 2G is a plan view and two corresponding cross-sectional illustrations of the device after the second dielectric layer has been recessed to expose a portion of the via, according to an embodiment of the invention.

Referring now to FIG. 2G, a depth controlled dielectric removal process is performed to expose a top portion of the vias 220. In an embodiment, the top portion 228 of the via 220 may be exposed above the second dielectric layer 206. In an embodiment, the dielectric removal process may include a wet etch, a dry etch (e.g., a plasma etch), a wet blast, or a laser ablation (e.g., by using excimer laser). According to an additional embodiment, the depth controlled dielectric removal process may be performed only proximate to the vias 220. For example, laser ablation of the second dielectric layer 206 may be localized proximate to the location of the vias 220.

Figure 2H:
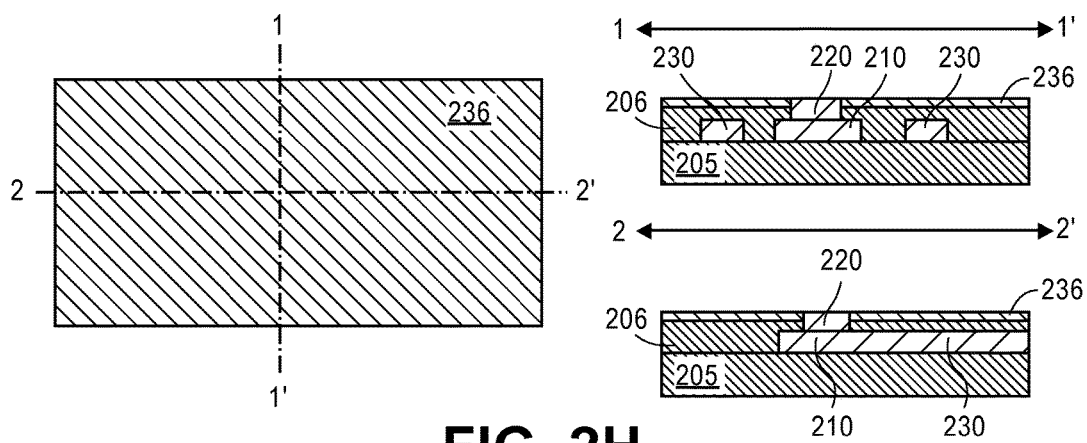
FIG. 2H is a plan view and two corresponding cross-sectional illustrations of the device after a seed layer has been formed over the second dielectric layer, according to an embodiment of the invention.

Referring now to FIG. 2H, a second seed layer 236 may be formed over the exposed portions of the second dielectric layer 206. According to an embodiment of the invention, the second seed layer 236 is a seed layer suitable for use in growing conductive features on the surface of the second dielectric layer 206. For example, the second seed layer 236 may be a copper seed layer.

Figure 2I:
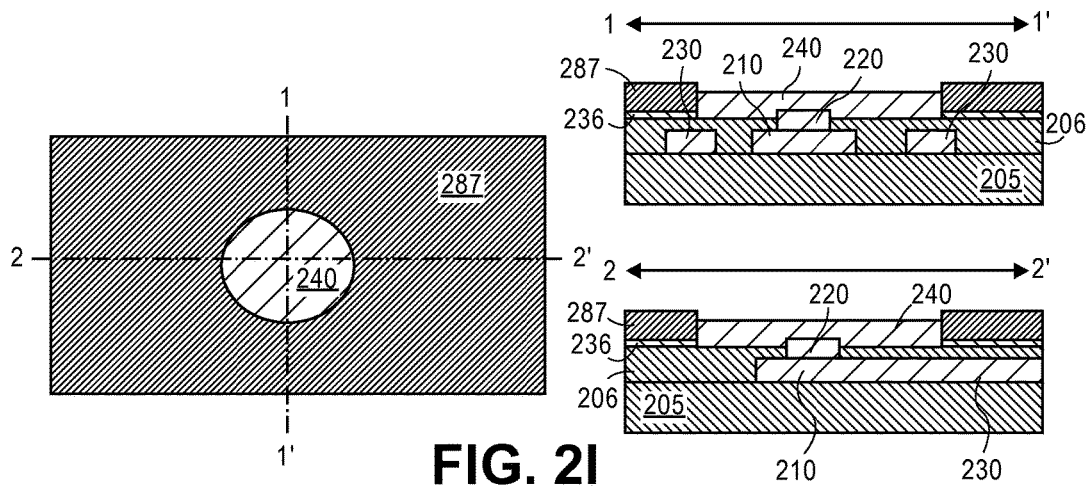
FIG. 2I is a plan view and two corresponding cross-sectional illustrations of the device after a third photoresist material has been deposited and patterned to form a pad above the via, according to an embodiment of the invention.
Figure 2J:
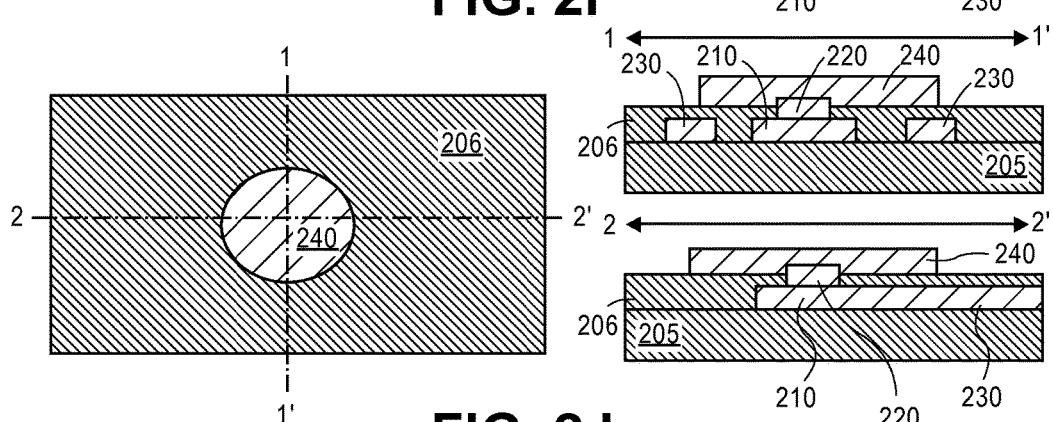
FIG. 2J is a plan view and two corresponding cross-sectional illustrations of the device after the third photoresist layer and the second seed layer have been removed, according to an embodiment of the invention.

Referring now to FIG. 2I, a third photoresist material 287 is deposited and patterned to form openings for the next level of conductive features. According to an embodiment, the next level of conductive features may then be formed with a suitable process, such as electroplating, electroless plating, or the like, as illustrated in FIG. 2J. As illustrated, the recessing of the second dielectric layer 206 creates an exposed portion 228 of the via 220 that protrudes from the top surface of the second dielectric layer 206. Accordingly, a discontinuity in the grain structure may be present at that interface between the via 220 and the pad 240, according to an embodiment. For example, the grain structure of the via 220 may be observed as extending into the pad 240, as illustrated in FIG. 2J.

According to an embodiment, a large pad 240 may be formed over the top surface of the via 220. For example, the large pad 240 may be a controlled collapse chip connection (C4) pad when the layer of pad 240 is the last layer. The use of the lithographically defined via 220 allows for the C4 pad 240 to span over the top surfaces of conductive lines 230 below. For example, in the cross-sectional view along line 1-1' in FIG. 2J, the pad 240 extends above the top surfaces of the neighboring conductive lines 230 in the layer below. In an additional embodiment, the large pad 240 may be a larger via pad for use in a subsequent routing layer. For example, the high density routing provided in the lower layer may not be needed in subsequent layers. As such, embodiments of the invention may include forming a large pad 240 that is suitable for use with laser drilled vias. Accordingly, embodiments of the invention may include vias that are defined by laser drilling and lithography.

According to an additional embodiment, a second via pad similar to the first via pad 210 may be formed over the top surface of the via 220. In such an embodiment, the high density routing may be continued for an additional layer. According to yet another embodiment of the invention, the pad 240 formed over the exposed via 220 may be omitted. Such an embodiment may be useful when a line-to-line first level interconnect (L2L FLI) architecture is used.

Figure 3:
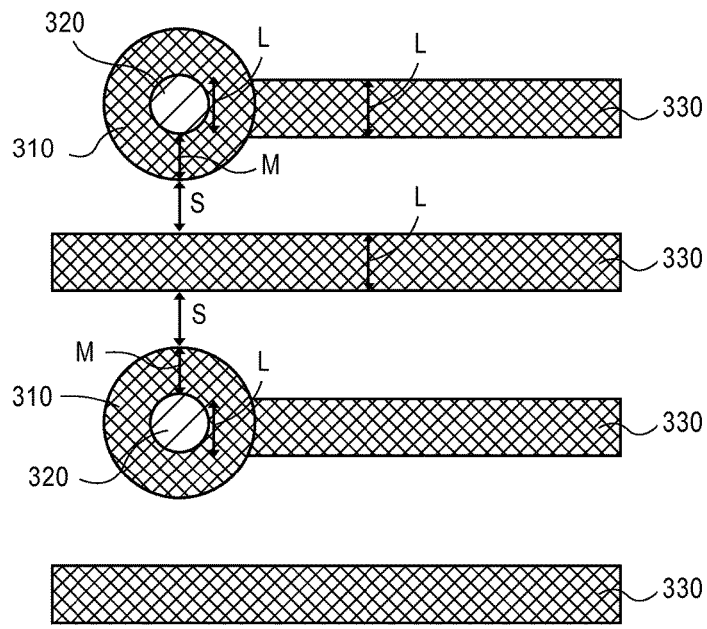
FIG. 3 is a schematic plan view illustration that illustrates how the misalignment, the minimum line width, and the minimum spacing contribute to the I/O density, according to an embodiment of the invention.

Referring now to FIG. 3, a plan view of conductive lines 330, via pads 310, and vias 320 is illustrated, according to an embodiment of the invention. It is to be appreciated that the dielectric material and subsequent layers are omitted for simplicity. As illustrated in FIG. 3, the minimum line width is L, the minimum spacing is S, and the mask to mask misalignment is M. According to an embodiment, the worst case minimum pitch is calculated by the equation (L+M+S). This is the worst case scenario because there is only a single conductive line 330 formed between each pad 310. However, it is to be appreciated that the effective I/O density is capable of being higher when two or more lines are routed between pads. According to an embodiment, the minimum line width L may be less than 20 μm, the minimum spacing S may be less than 30 μm, and the mask to mask misalignment M may be less than 15 μm. In one particular embodiment, where L is 9 μm, S is 12 μm, and M is 7 μm, (L+M+S)=28 μm, which results in an I/O density of approximately 35 IO/mm. Additional embodiments may include minimum line width L and spacing S that is approximately 2 μm or less, which allows for even greater I/O densities.

According to an additional embodiment of the invention, the vias between layers may also be self-aligned vias. When self-aligned vias are formed, the use of a via pad may not be necessary. A process for forming such self-aligned vias according to an embodiment of the invention is illustrated in FIGS. 4A-4H.

Figure 4A:
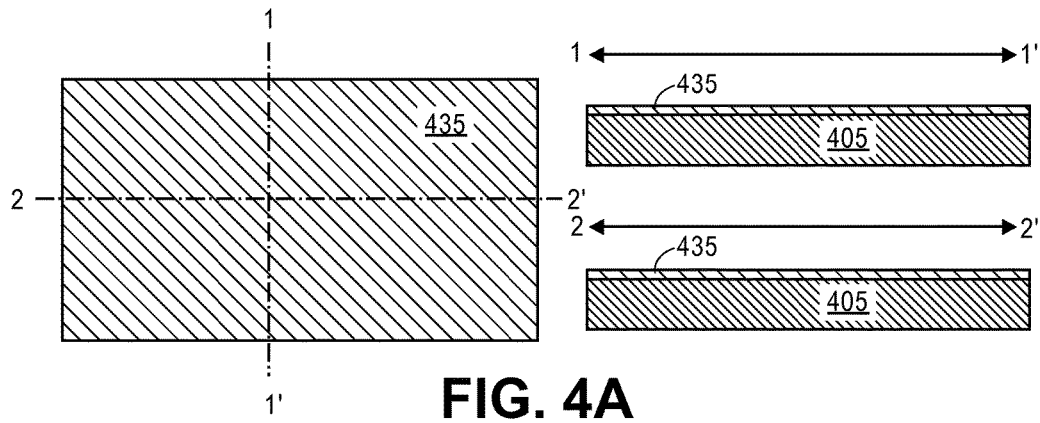
FIG. 4A is a plan view and two corresponding cross-sectional illustrations of a dielectric layer with a seed layer formed over the surface, according to an embodiment of the invention.

Referring now to FIG. 4A, embodiments of the invention may include a seed layer 435 that is deposited over a top surface of a dielectric substrate layer 405. By way of example, the dielectric layer 405 may be a polymer material, such as, for example, polyimide, epoxy or build-up film (BF). In an embodiment, the dielectric layer 405 may be one layer in a stack that includes a plurality of dielectric layers used to form a build-up structure. As such, the dielectric layer 405 may be formed over another dielectric layer. Additional embodiments may include forming the dielectric layer 405 as the first dielectric layer over a core material on which the stack is formed. In an embodiment, the seed layer 435 may be a copper seed layer.

Figure 4B:
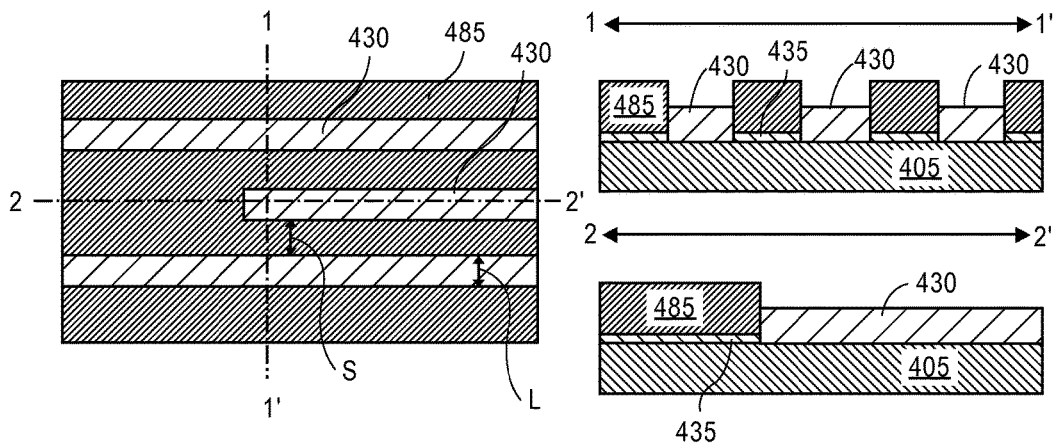
FIG. 4B is a plan view and two corresponding cross-sectional illustrations of the device after conductive lines have been formed over the surface, according to an embodiment of the invention.

Referring now to FIG. 4B, a photoresist material 485 may be formed over the seed layer 435 and patterned to provide openings for the formation of conductive lines 430. In contrast to the previous process flow, embodiments may not require via pads because the subsequently formed vias will be self-aligned. According to an embodiment, the patterning of the photoresist material 485 may be implemented with lithographic processes (e.g., exposed with a radiation source through a routing layer mask (not shown) and developed with a developer). After the photoresist material 485 has been patterned the conductive lines 430 may be formed. In an embodiment, the conductive lines 430 may be formed with an electroplating process, an electroless plating process, or the like.

Embodiments of the invention that use lithography operations allow for the minimum feature size and misalignment to be reduced. As such, the minimum line width L and the minimum spacing S of the patterned features may be smaller than would otherwise be possible when laser drilling is used to form the vias. As such, embodiments of the invention may include a minimum line width L and spacing S that are limited only by the lithography equipment utilized. According to an embodiment, the minimum line width L may be less than 20 μm and the minimum spacing S may be less than 30 μm. In one particular embodiment, the line width L may be 9 μm or smaller, and the spacing S may be 12 μm or smaller. According to an additional embodiment, the minimum line width L and the minimum spacing S may both be approximately 2 μm or less.

Figure 4C:
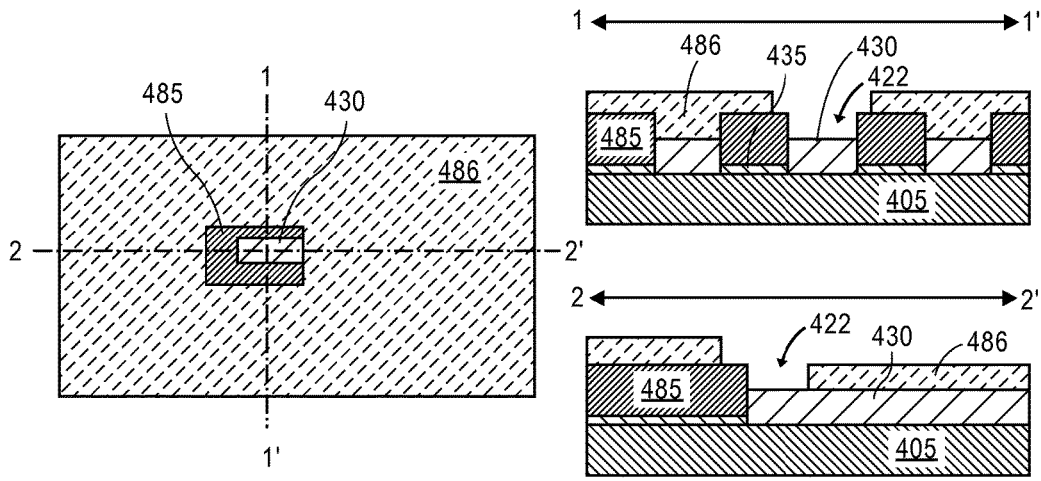
FIG. 4C is a plan view and two corresponding cross-sectional illustrations of the device after a second photoresist material is deposited and patterned to form via openings, according to an embodiment of the invention.

Referring now to FIG. 4C, a second photoresist material 486 is applied, and patterned with a via layer mask (not shown) to form via openings 422. The width of the opening needs to account for any misalignment during the patterning of the second photoresist material. Accordingly, the width of the via opening 422 may be at least the minimum line width L plus twice the misalignment for the lithography process. In some embodiments, the width of the opening 422 reveals a surface of the first photoresist material 485 in addition to a portion of the conductive line 430.

In the illustrated embodiment the second photoresist material 486 is deposited over the top surface of the first photoresist material 485, though embodiments are not limited to such configurations. For example, the first photoresist material 485 may be stripped and the seed layer 435 may be removed with a flash etching process prior to the deposition of the second photoresist material 486. In such an embodiment, the second photoresist material 486 may then be deposited directly over the first dielectric layer 405 and the conductive lines 430.

Figure 4D:
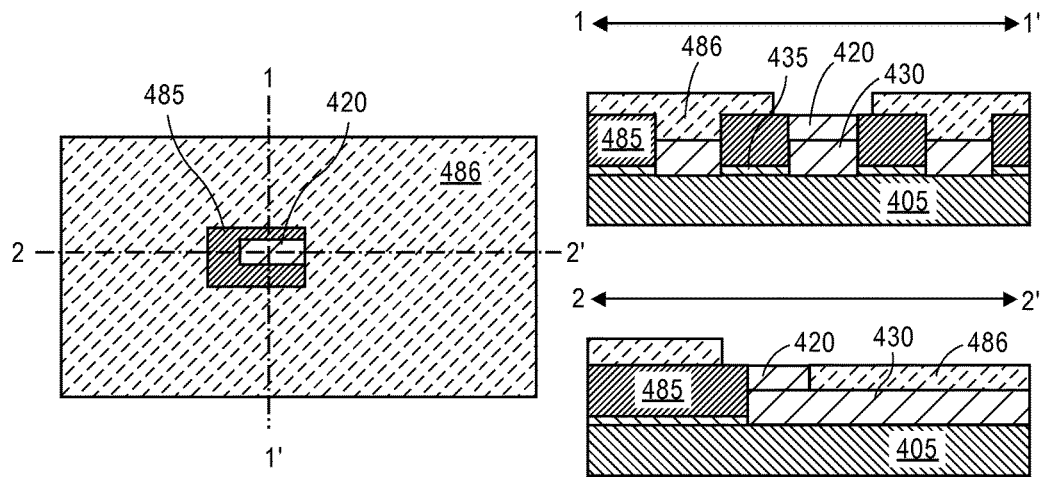
FIG. 4D is a plan view and two corresponding cross-sectional illustrations of the device after the via has been formed in the via opening, according to an embodiment of the invention.

Referring now to FIG. 4D, the via 420 is formed in the via opening 422. According to an embodiment, the via 420 may be formed with an electroplating process, an electroless plating process, or the like. Even though the via opening 422 may not be perfectly aligned with the underlying conductive line, the via 420 will still be self-aligned with the underlying conductive line 430 because the deposition process (e.g., electroplating, electroless plating, etc.) will only grow over the exposed portions of the conductive line 430.

Figure 4E:
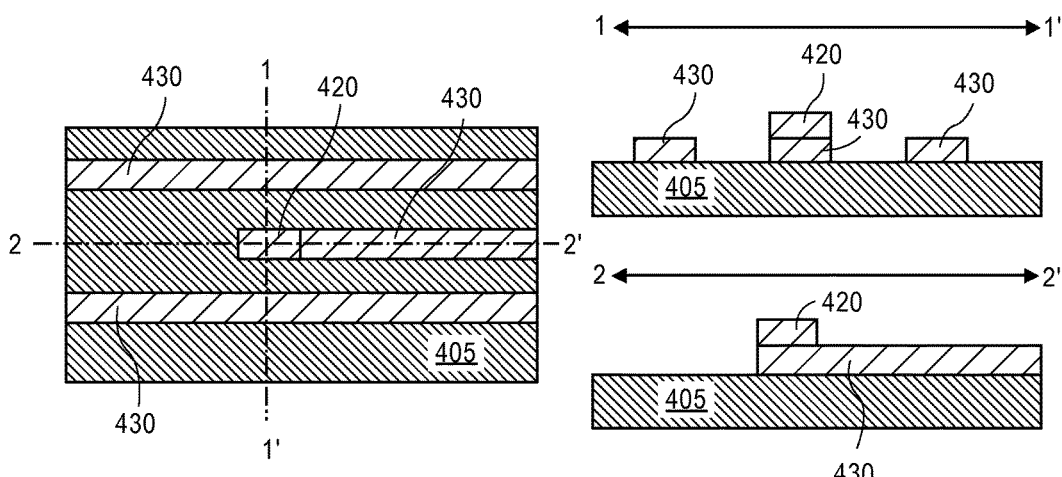
FIG. 4E is a plan view and two corresponding cross-sectional illustrations of the device after the first and second photoresist layers and the seed layer are removed, according to an embodiment of the invention.

Referring now to FIG. 4E, the first and second photoresist materials 485, 486 and the seed layer 435 may be removed. For example, the photoresist materials may be stripped, and the seed layer 435 may be removed with a flash etching process.

Figure 4F:
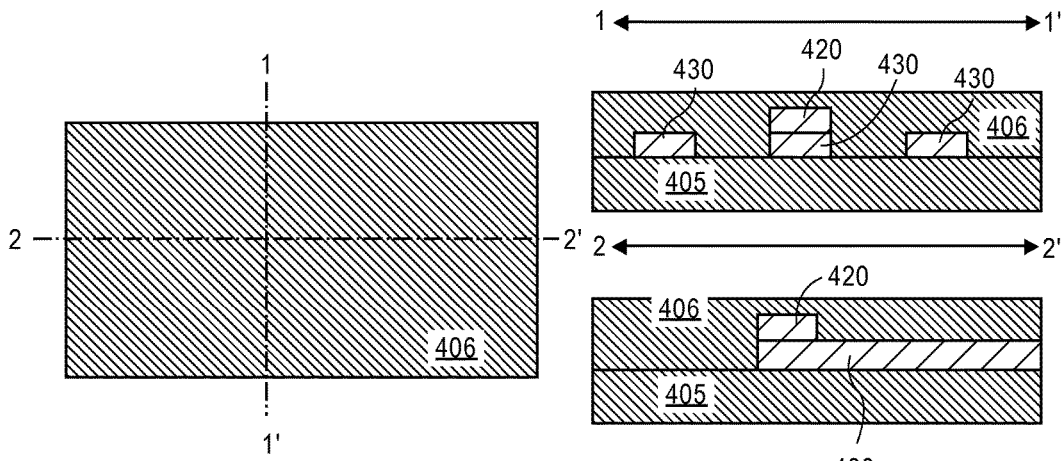
FIG. 4F is a plan view and two corresponding cross-sectional illustrations of the device after a second dielectric layer has been formed over the surface, according to an embodiment of the invention.

Referring now to FIG. 4F, a second dielectric layer 406 is deposited over the first dielectric layer 405, the conductive lines 430 and the via 420. According to an embodiment the second dielectric layer 406 may be formed with any suitable process, such as lamination or slit coating and curing. In an embodiment, the second dielectric layer 406 is formed to a thickness that will completely cover a top surface of the via 420 to account for uneven surfaces and to ensure that the desired minimum thickness is reached across the entire substrate. In some embodiments, the thickness of the second dielectric layer 406 is minimized in order to reduce the etching time required to expose the vias 420 in a subsequent processing operation.

Figure 4G:
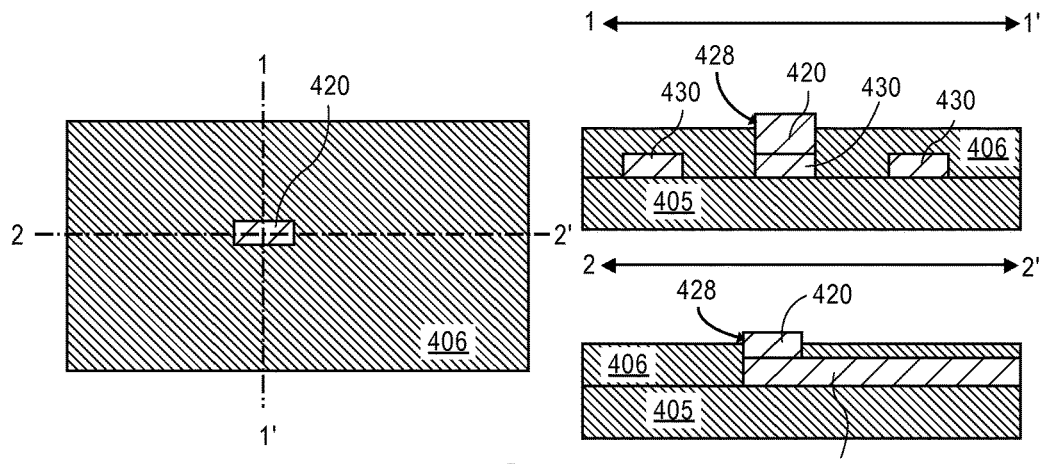
FIG. 4G is a plan view and two corresponding cross-sectional illustrations of the device after the second dielectric layer has been recessed to expose a portion of the via, according to an embodiment of the invention.

Referring now to FIG. 4G, a depth controlled dielectric removal process is performed to expose a top portion of the via 420. In an embodiment, the portion 428 of the via 220 may be exposed above the second dielectric layer 406. In an embodiment, the dielectric removal process may include a wet etch, a dry etch (e.g., a plasma etch), a wet blast, or a laser ablation (e.g., by using excimer laser). According to an additional embodiment, the depth controlled dielectric removal process may be performed only proximate to the vias 420. For example, laser ablation of the second dielectric layer 406 may be localized proximate to the location of the vias 420.

Figure 4H:
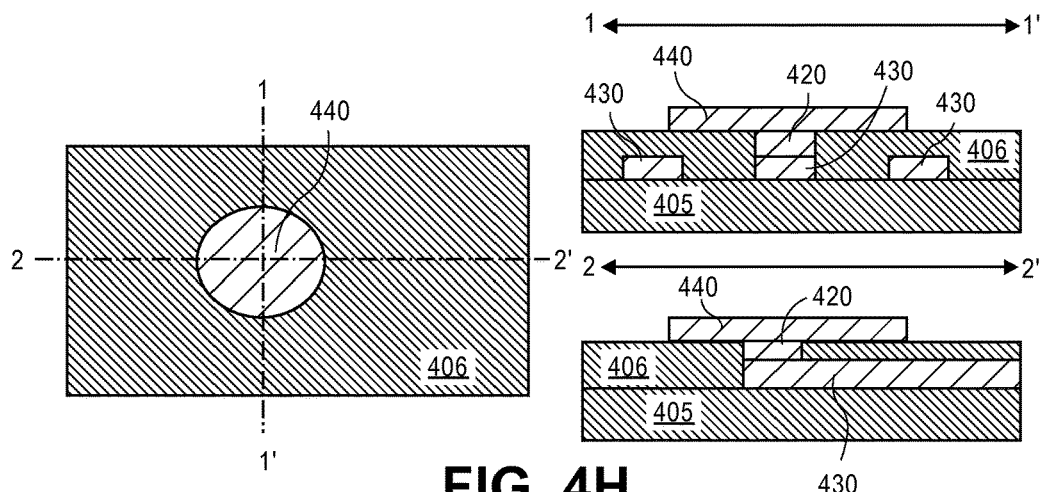
FIG. 4H is a plan view and two corresponding cross-sectional illustrations of the device after a pad is formed above the via, according to an embodiment of the invention.

Referring now to FIG. 4H, a pad 440 may be formed over the top surface of second dielectric layer 406. According to an embodiment, the pad 440 may be formed using any suitable process. For example, a second seed layer may be formed, and a photoresist material may be deposited and patterned, similar to how the pad 240 was formed in the previous flow. In an embodiment, the pad 440 may be a C4 pad when the layer of pad 440 is the last layer. The use of the lithographically defined via 420 allows for the C4 pad 440 to span over the top surfaces of conductive lines 430 below. For example, in the cross-sectional view along line 1-1' in FIG. 4H, the pad 440 extends above the top surfaces of the neighboring conductive lines 430 in the layer below.

In an additional embodiment, the pad 440 may be a larger via pad for use in a subsequent routing layer. For example, the high density routing provided in the lower layer may not be needed in subsequent layers. As such, embodiments of the invention may include forming a large pad 440 that is suitable for use with laser drilled vias. Accordingly, embodiments of the invention may include vias that are defined by laser drilling and lithography. According to an additional embodiment of the invention, the pad 440 formed over the exposed via 420 may be omitted. Such an embodiment may be useful when a L2L FLI architecture is used.

Figure 5:
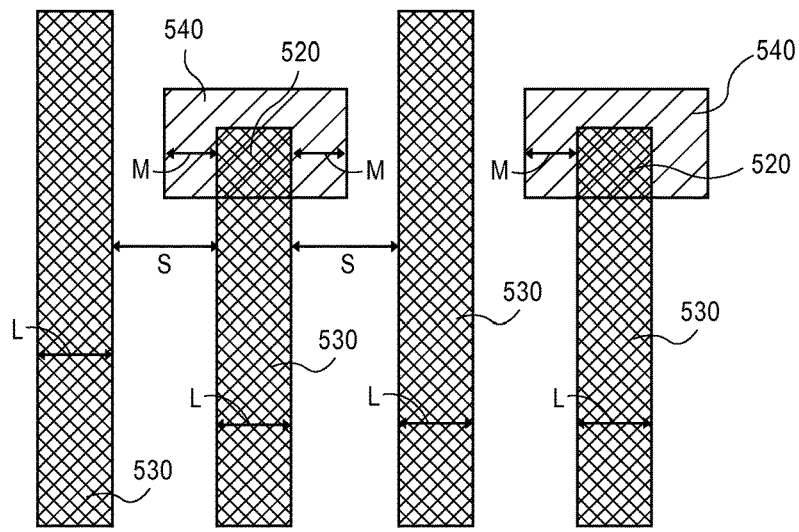
FIG. 5 is a schematic plan view illustration that illustrates how the misalignment, the minimum line width, and the minimum spacing contribute to the I/O density, according to an embodiment of the invention.

Referring now to FIG. 5, a plan view of conductive lines 530, via openings 540, and vias 520 are illustrated, according to an embodiment of the invention. It is to be appreciated that the dielectric material and subsequent layers are omitted for simplicity. As illustrated in FIG. 5, the minimum line width is L, the minimum spacing is S, and the mask to mask misalignment is M. In the self-aligned via embodiment, the worst case minimum pitch that is capable of being produced may be dependent on whether the value of the minimum spacing S is larger than twice the misalignment M. When twice the misalignment 2M is greater than the minimum spacing S, the worst case minimum pitch may be calculated with the equation (2M+L). When the minimum spacing S is greater than twice the misalignment 2M, the worst case minimum pitch may be calculated with the equation (S+L). According to an embodiment, the minimum line width L may be less than 20 μm, the minimum spacing S may be less than 30 μm, and the mask to mask misalignment M may be less than 15 μm. In one particular embodiment, where L is 9 μm, S is 12 μm, and M is 7 μm, the worst case minimum pitch would be (max(2M,S)+L)=23 μm, which is about 43 IO/mm. Additional embodiments may include minimum line width L and spacing S that is approximately 2 μm or less, which allows for even greater I/O densities. Additionally, it is to be appreciated that the effective I/O density is capable of being higher when two or more lines are routed between vias compared to the illustrated single-track routing.

Additional embodiments of the invention further include process flows in which the second dielectric layer is formed prior to the formation of the via openings. However, unlike the processes which uses laser drilling to create vias, embodiments of the invention may utilize plasma etching of the second dielectric to create the via openings. In order to utilize plasma etching to form the via openings, a mask layer may need to be formed and patterned using lithography, thus enabling the same I/O density increases that are available when the process flow illustrated with respect to FIGS. 2A-2J described above is used. A process flow for forming the vias according to such an embodiment is illustrated in FIGS. 6A-6D.

Figure 6A:
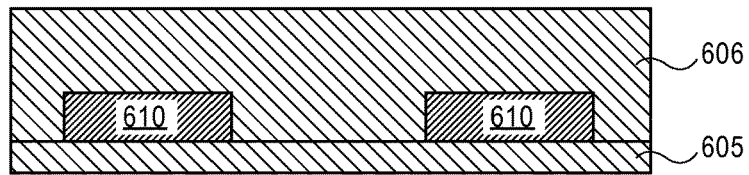
FIG. 6A is a cross-sectional illustration of via pads formed over a dielectric layer, according to an embodiment of the invention.

Referring now to FIG. 6A, two pads 610 have been formed over a first dielectric layer 605. According to an embodiment, a second dielectric layer 606 may be formed over the first dielectric layer 605 and the pads 610. For example, the second dielectric layer may be formed with any suitable process, such as lamination or slit coating and curing.

Figure 6B:
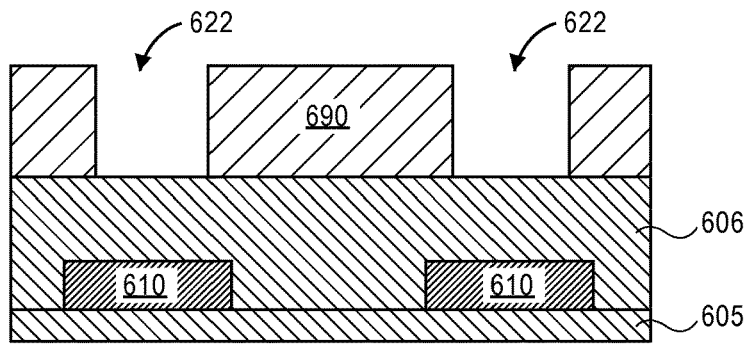
FIG. 6B is a cross-sectional illustration of the device after a mask layer is deposited over a second dielectric layer and patterned, according to an embodiment of the invention.

Referring now to FIG. 6B, embodiments of the invention include depositing a photoresist 690 over the second dielectric layer. According to an embodiment, the photoresist 690 may then be patterned to form via openings 622. In some embodiments, the photoresist 690 may be opaque. In such embodiments, an alignment mark (not shown) below the photoresist 690 may be revealed with a laser drilling process. After the alignment mark is revealed, a via layer mask (not shown) may be aligned with the alignment mark and used to pattern the via openings 622 into the photoresist 690.

Figure 6C:
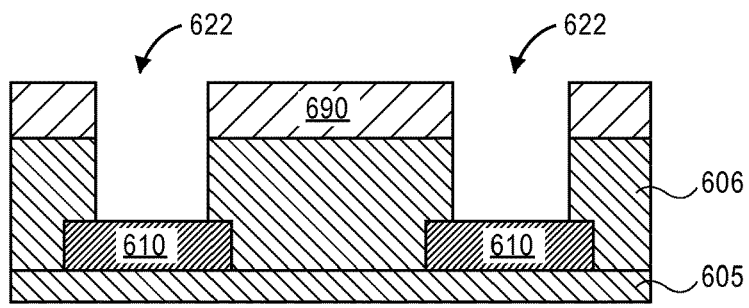
FIG. 6C is a cross-sectional illustration of the device after the second dielectric layer is patterned to form via openings, according to an embodiment of the invention.

Referring now to FIG. 6C, the second dielectric layer 606 is patterned using the photoresist 690 as a mask in order to transfer the via openings 622 into the second dielectric layer 606. Embodiments of the invention include an anisotropic etching process that provides substantially vertical sidewalls for the via openings 622 in the second dielectric layer 606. For example, the second dielectric layer 606 is etched with a dry etching process, such as a plasma etch. As illustrated in FIG. 6C, the dry etching process may also etch the photoresist 690. Accordingly, embodiments of the invention include a photoresist 690 that has a thickness that allows for a portion to be removed while still maintaining an etch mask for the second dielectric layer 606.

Figure 6D:
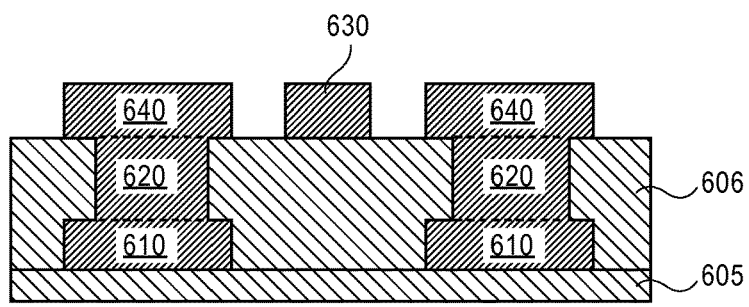
FIG. 6D is a cross-sectional illustration of the device after the vias are formed in the via openings, according to an embodiment of the invention.

Referring now to FIG. 6D, the remaining photoresist 690 may be stripped and the vias 620, the second pads 640, and the conductive lines 630 may be formed. In an embodiment, a seed layer (not shown) may be formed first, followed by a metal deposition process. For example, the metal deposition process may be a blanket electroless plating process, an electroplating process, or the like. After the blanket deposition process, a lithography process may then be used to define the pads 640 and the conductive lines 630. In an embodiment, the pad 640 may be a C4 pad when the layer of pad 640 is the last layer. In an additional embodiment, the pad 640 may be a larger via pad for use in a subsequent routing layer. For example, the high density routing provided in the lower layer may not be needed in subsequent layers. As such, embodiments of the invention may include forming a large pad 640 that is suitable for use with laser drilled vias. Accordingly, embodiments of the invention may include vias that are defined by laser drilling and lithography.

According to an additional embodiment, a second via pad similar to the first via pad 610 may be formed over the top surface of the via 620. In such an embodiment, the high density routing may be continued for an additional layer. According to an additional embodiment of the invention, the pad 640 formed over the exposed via 620 may be omitted. Such an embodiment may be useful when a L2L FLI architecture is used.

Embodiments of the invention may also utilize a process flow in which the second dielectric layer is formed prior to the formation of the via openings and the hardmask layer further includes an etchstop layer. Such an embodiment is illustrated in FIGS. 7A-7F.

Figure 7A:
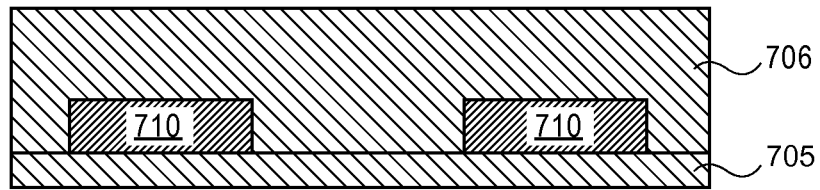
FIG. 7A is a cross-sectional illustration of via pads formed over a dielectric layer, according to an embodiment of the invention.

Referring now to FIG. 7A, two pads 710 have been formed over a first dielectric layer 705. According to an embodiment, a second dielectric layer 706 may be formed over the first dielectric layer 705 and the pads 710. For example, the second dielectric layer may be formed with any suitable process, such as lamination or slit coating and curing.

Figure 7B:
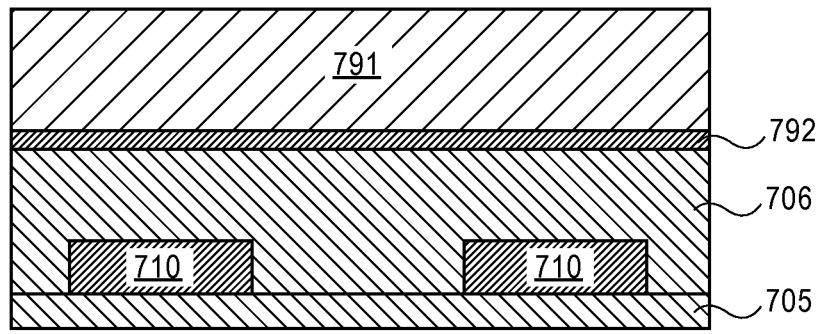
FIG. 7B is a cross-sectional illustration of the device after a mask layer with an etchstop layer is deposited over a second dielectric layer, according to an embodiment of the invention.

Referring now to FIG. 7B, embodiments of the invention include depositing an etchstop layer 792 over the second dielectric layer 706. A photoresist 791 may then be formed over the etchstop layer 792. According to an additional embodiment, the etchstop layer 792 may also be formed as a cladding layer over the second dielectric layer 706. Accordingly, a separate deposition process to form the etchstop layer 792 may be omitted in some embodiments. By way of example, the etchstop layer 792 may be a copper layer. According to an embodiment, the photoresist 791 may then be patterned to form via openings 722 through the photoresist 791. The via opening 722 may stop at the etchstop layer 792. In some embodiments, the photoresist 791 may be opaque. In such embodiments, an alignment mark (not shown) below the photoresist 791 may be revealed with a laser drilling process. After the alignment mark is revealed, a via layer mask (not shown) may be aligned with the alignment mark and used to pattern the via openings 722 into the DFR 791.

Figure 7C:
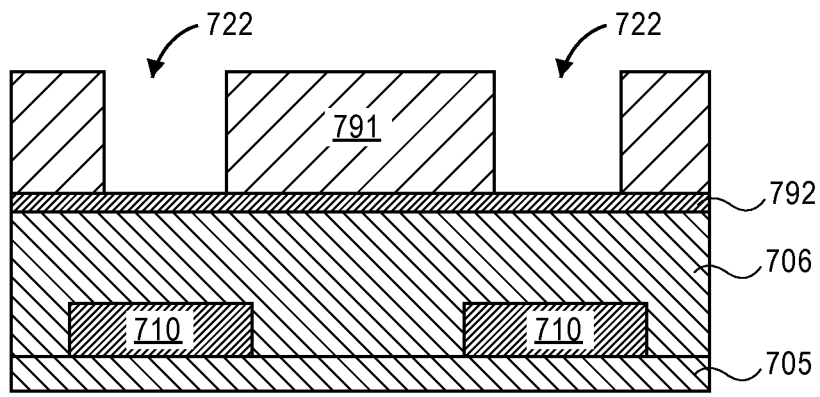
FIG. 7C is a cross-sectional illustration of the device after the mask layer is patterned, according to an embodiment of the invention.
Figure 7D:
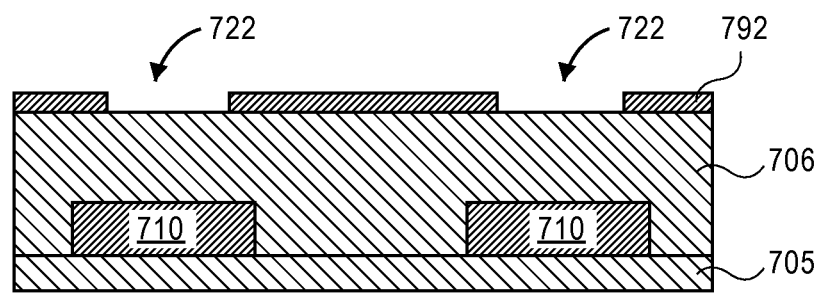
FIG. 7D is a cross-sectional illustration of the device after the etchstop layer is patterned, according to an embodiment of the invention.

Referring now to FIG. 7C, the patterned photoresist 791 may be used as an etch mask for the etchstop layer 792. In an embodiment, the etchstop layer 792 may be etched with a wet etching process. After the via openings 722 are transferred into the etchstop layer 792, the photoresist 791 may be stripped, as illustrated in FIG. 7D.

Figure 7E:
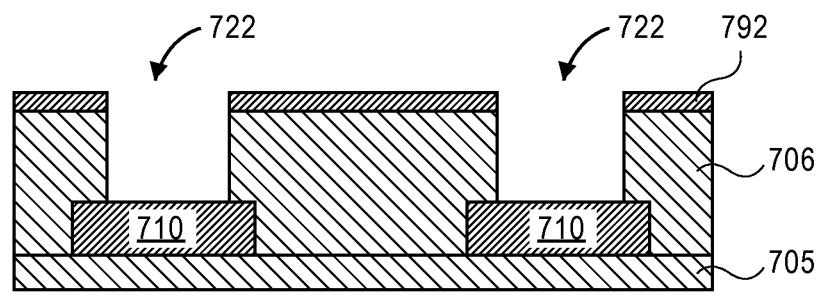
FIG. 7E is a cross-sectional illustration of the device after the second dielectric layer is patterned to form via openings, according to an embodiment of the invention.
Figure 7F:
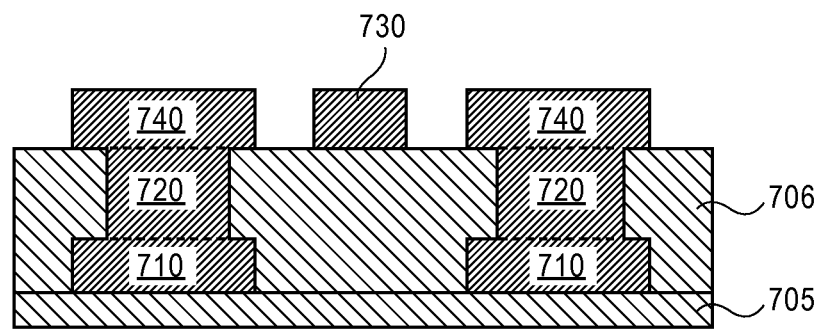
FIG. 7F is a cross-sectional illustration of the device after the vias are formed in the via openings, according to an embodiment of the invention.

Referring now to FIG. 7E, the second dielectric layer 706 is patterned using the etchstop layer 792 as a mask in order to transfer the via openings 722 into the second dielectric layer 706. Embodiments of the invention include an anisotropic etching process that provides substantially vertical sidewalls for the via openings 722 in the second dielectric layer 706. For example, the second dielectric layer 706 is etched with a dry etching process, such as a plasma etch. Since the etchstop layer 792 is a material that is not susceptible to the dry etch (e.g., a non-organic material), the control of the etch needed in the previously described flow is not necessary. Accordingly, the complexity of the etching process to form the via openings 722 in the second dielectric layer 706 is reduced.

Referring now to FIG. 7E, the remaining etchstop layer 792 may be etched away, and the vias 720, the second pads 740, and the conductive lines 730 may be formed. In an embodiment, a seed layer (not shown) may be formed first, followed by a metal deposition process. For example, the metal deposition process may be a blanket electroless plating process, an electroplating process, or the like. After the blanket deposition process, a lithography process may then be used to define the pads 740 and the conductive lines 730. In an embodiment, the pad 740 may be a C4 pad when the layer of pad 740 is the last layer. In an additional embodiment, the pad 740 may be a larger via pad for use in a subsequent routing layer. According to an additional embodiment, a second via pad similar to the first via pad 710 may be formed over the top surface of the via 720. According to an additional embodiment of the invention, the pad 740 formed over the exposed via 720 may be omitted.

Depending on the technology parameters, some of the embodiments of the invention will provide better I/O density compared to the others. For example, when the mask misalignment (M) is relatively large, the self-aligned process (i.e., embodiments that use a process similar to the one illustrated in FIGS. 4A-4H) requires larger spacing between the lines in order to avoid creating vias on the neighboring lines. Accordingly, the non-self-aligned processes (e.g., embodiments that utilize the processes similar to the ones illustrated in FIGS. 2A-2J, FIGS. 6A-6D, and FIGS. 7A-7F) may provide an improved I/O density. Alternatively, if the misalignment is relatively low, embodiments that use a self-aligned process similar to the one illustrated in FIGS. 4A-4H may provide the highest I/O density.

Embodiments of the invention provide several advantages. For example, the routing density can be increased by twofold or more without changing the L/S requirements. As such, embodiments of the invention offer layer count reduction (i.e., half of the escape routing layers) while using the same tooling and materials. Additionally, there is no need for novel resists or dielectrics (such as photodefinable dielectrics), or lithography tooling for finer line and space than is currently available, which can help lower cost.

Figure 8:
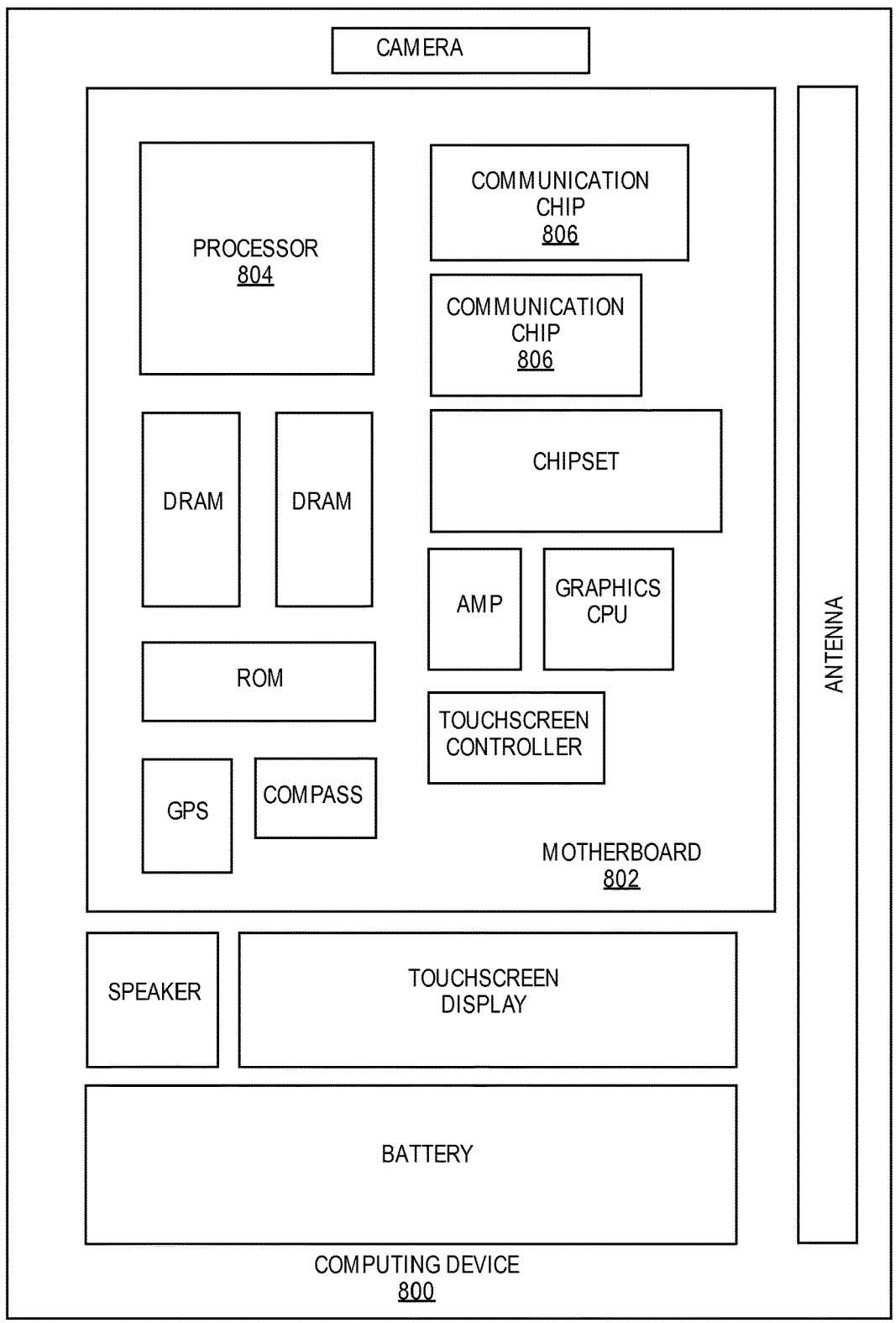
FIG. 8 is a schematic of a computing device built in accordance with an embodiment of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as devices that include vias between interconnect lines that are lithographically patterned in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as devices that include vias between interconnect lines that are lithographically patterned in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a method of forming a conductive via comprising: forming a via pad over a first dielectric layer; depositing a photoresist layer over the first dielectric layer and the via pad; patterning the photoresist layer to form a via opening over the via pad; depositing a conductive material into the via opening to form a via over the via pad; removing the photoresist layer; forming a second dielectric layer over the first dielectric layer, the via pad, and the via, wherein a top surface of the second dielectric layer is formed above a top surface of the via; and recessing the second dielectric layer to expose a top portion of the via.

Additional embodiments of the invention include a method, wherein recessing the second dielectric layer includes a wet etch, a dry etch, a wet blast, or a laser ablation process.

Additional embodiments of the invention include a method, wherein the recessing is a laser ablation process, and wherein the recessing is only implemented proximate to the via.

Additional embodiments of the invention include a method, further comprising forming a plurality of via openings.

Additional embodiments of the invention include a method, wherein the plurality of via openings are formed in the photoresist layer with a single patterning process.

Additional embodiments of the invention include a method, wherein the plurality of via openings are formed with a plurality of shapes or a plurality of sizes.

Additional embodiments of the invention include a method, further comprising forming a second pad over the second dielectric layer and the via.

Additional embodiments of the invention include a method, wherein the second pad is a C4 pad.

Additional embodiments of the invention include a method, wherein the second pad is substantially similar to the via pad.

Additional embodiments of the invention include a method, wherein the second pad is large enough to be contacted by a subsequently formed via formed with a laser drilling process.

Additional embodiments of the invention include a method, wherein the via opening is formed with substantially vertical sidewalls.

Another additional embodiment of the invention includes a method of forming a conductive via, comprising: depositing a first photoresist material over a first dielectric layer and patterning the first photoresist material to form a conductive line opening; forming a conductive line in the conductive line opening; depositing a second photoresist material over the first photoresist material, the first dielectric layer, and the conductive line; patterning the second photoresist material to form a via opening over the conductive line; depositing a conductive material into the via opening to form a via, wherein the conductive material only deposits on the portions of the exposed conductive line; removing the first photoresist layer and the second photoresist layer; forming a second dielectric layer over the first dielectric layer, the conductive line, and the via, wherein a top surface of the second dielectric layer is formed above a top surface of the via; and recessing the second dielectric layer to expose a top portion of the via.

Additional embodiments of the invention include a method, wherein the via opening exposes a portion of the conductive line and a portion of the first photoresist material.

Additional embodiments of the invention include a method, further comprising:
removing the first photoresist material prior to depositing the second photoresist material, wherein the second photoresist material is deposited directly over the first dielectric layer and the conductive line.

Additional embodiments of the invention include a method, wherein recessing the second dielectric layer includes a wet etch, a dry etch, a wet blast, or a laser ablation process.

Additional embodiments of the invention include a method, wherein the recessing is a laser ablation process, and wherein the recessing is only implemented proximate to the via.

Additional embodiments of the invention include a method, wherein the via opening has substantially vertical sidewalls.

Additional embodiments of the invention include a method, further comprising forming a second pad over the second dielectric layer and the via.

Another additional embodiment of the invention includes a method of forming a conductive via, comprising: forming a via pad over a first dielectric layer; forming a second dielectric layer over the via pad and the first dielectric layer; depositing a hardmask layer over the second dielectric layer;

patterning the hardmask layer to form a via opening in the hardmask layer; transferring the via opening in the hardmask layer to the second dielectric layer with a dry etching process, wherein the sidewalls of the via opening are substantially vertical; and depositing a conductive material into the via opening to form a via.

Additional embodiments of the invention include a method, further comprising: exposing an alignment mark below the hardmask layer with a laser ablation process; and using the alignment mark to align a via patterning mask above the hardmask layer prior to patterning the hardmask layer.

Additional embodiments of the invention include a method, further comprising: forming an etchstop layer over the second dielectric layer prior to depositing the hardmask layer.

Additional embodiments of the invention include a method, wherein the etchstop layer is a cladding layer formed over the second dielectric layer.

Additional embodiments of the invention include a method, further comprising:
transferring the via opening pattern from the hardmask layer into the etchstop layer; removing the hardmask layer from over the etchstop layer; and transferring the via opening pattern from the etchstop layer into the second dielectric layer.

Embodiments of the invention include an electrical package comprising: a first dielectric layer; a plurality of conductive lines formed over the first dielectric layer; a plurality of vias electrically coupled to the plurality of conductive lines; a second dielectric layer formed over the conductive lines and around the plurality of vias, wherein a top portion of the plurality of vias extend above a top surface of the second dielectric layer; and a plurality of second pads formed over the second dielectric layer and each electrically coupled to one of the plurality of vias, wherein the interface between the plurality of vias and the second pads produce a discontinuous grain structure.

Additional embodiments of the invention include an electrical package, wherein the plurality of vias are coupled to the conductive lines by via pads formed on the first dielectric layer.

Additional embodiments of the invention include an electrical package, wherein the vias have substantially vertical sidewalls.

Additional embodiments of the invention include an electrical package, wherein the second pads are C4 pads.

Additional embodiments of the invention include an electrical package, wherein the second pad is substantially similar to the via pad.

Additional embodiments of the invention include an electrical package, further comprising a second plurality of vias that include tapered sidewalls that are each electrically coupled to one of the plurality of second pads.

Additional embodiments of the invention include an electrical package, wherein the plurality of vias are line-to-line first level interconnects.

What is claimed is:
1. A method of forming a conductive via comprising:
  forming a via pad over a first dielectric layer;
  depositing a photoresist layer over the first dielectric layer and the via pad;
  patterning the photoresist layer to form a via opening over the via pad;
  depositing a conductive material into the via opening to form a via over the via pad;
  removing the photoresist layer;
  forming a second dielectric layer over the first dielectric layer, the via pad, and the via, wherein a top surface of the second dielectric layer is formed above a top surface of the via; and
  recessing the second dielectric layer to expose a top portion of the via, wherein a top surface of the recessed second dielectric layer is below the top surface of the via.

2. The method of claim 1, wherein recessing the second dielectric layer includes a wet etch, a dry etch, a wet blast, or a laser ablation process.

3. The method of claim 2, wherein the recessing is a laser ablation process, and wherein the recessing is only implemented proximate to the via.

4. The method of claim 1, further comprising forming a plurality of via openings.

5. The method of claim 4, wherein the plurality of via openings are formed in the photoresist layer with a single patterning process.

6. The method of claim 5, wherein the plurality of via openings are formed with a plurality of shapes or a plurality of sizes.

7. The method of claim 1, further comprising forming a second pad over the second dielectric layer and the via.

8. The method of claim 7, wherein the second pad is substantially similar to the via pad.

9. The method of claim 7, wherein the second pad is large enough to be contacted by a subsequently formed via formed with a laser drilling process.

10. The method of claim 1, wherein the via opening is formed with substantially vertical sidewalls.

11. A method of forming a conductive via, comprising:
  depositing a first photoresist material over a first dielectric layer and patterning the first photoresist material to form a conductive line opening;
  forming a conductive line in the conductive line opening;
  depositing a second photoresist material over the first photoresist material, the first dielectric layer, and the conductive line;
  patterning the second photoresist material to form a via opening over the conductive line, wherein the via opening exposes a portion of the conductive line and a portion of the first photoresist material;
  depositing a conductive material into the via opening to form a via, wherein the conductive material only deposits on the exposed portion of the conductive line;
  removing the first photoresist layer and the second photoresist layer;
  forming a second dielectric layer over the first dielectric layer, the conductive line, and the via, wherein a top surface of the second dielectric layer is formed above a top surface of the via; and
  recessing the second dielectric layer to expose a top portion of the via.

12. The method of claim 11, wherein recessing the second dielectric layer includes a wet etch, a dry etch, a wet blast, or a laser ablation process.

13. The method of claim 12, wherein the recessing is a laser ablation process, and wherein the recessing is only implemented proximate to the via.

14. The method of claim 11, wherein the via opening has substantially vertical sidewalls.

15. The method of claim 11, further comprising forming a second pad over the second dielectric layer and the via.

16. A method of forming a conductive via, comprising:
  forming a via pad over a first dielectric layer;

forming a second dielectric layer over the via pad and the first dielectric layer;

depositing a hardmask layer over the second dielectric layer;

patterning the hardmask layer to form a via opening in the hardmask layer;

transferring the via opening in the hardmask layer to the second dielectric layer with a dry etching process, wherein sidewalls of the via opening are substantially vertical, and wherein a width of the transferred via opening in the second dielectric layer is uniform through a thickness of the second dielectric layer, and wherein the width of the transferred via opening in the second dielectric layer is the same as a width of the via opening in the hardmask layer; and depositing a conductive material into the transferred via opening in the second dielectric layer to form a via, the method further comprising: exposing an alignment mark below the hardmask layer with a laser ablation process; and using the alignment mark to align a via patterning mask above the hardmask layer prior to patterning the hardmask layer.

17. The method of claim 16, further comprising:

forming an etchstop layer over the second dielectric layer prior to depositing the hardmask layer.

18. The method of claim 17, wherein the etchstop layer is a cladding layer formed over the second dielectric layer.

19. The method of claim 17, further comprising:

transferring the via opening from the hardmask layer into the etchstop layer;

removing the hardmask layer from over the etchstop layer; and transferring the via opening from the etchstop layer into the second dielectric layer.

* * * * *